US010763084B2

(12) United States Patent
Yanai et al.

(10) Patent No.: US 10,763,084 B2
(45) Date of Patent: *Sep. 1, 2020

(54) SUBSTRATE PROCESSING APPARATUS, METHOD OF MANUFACTURING SEMICONDUCTOR DEVICE, AND BAFFLE STRUCTURE OF THE SUBSTRATE PROCESSING APPARATUS

(71) Applicant: HITACHI KOKUSAI ELECTRIC INC, Tokyo (JP)

(72) Inventors: Hidehiro Yanai, Toyama (JP); Shin Hiyama, Toyama (JP); Toru Kakuda, Toyama (JP); Toshiya Shimada, Toyama (JP); Tomihiro Amano, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/873,598

(22) Filed: Jan. 17, 2018

(65) Prior Publication Data

US 2018/0144908 A1     May 24, 2018

Related U.S. Application Data

(63) Continuation of application No. 13/306,277, filed on Nov. 29, 2011, now Pat. No. 9,911,580.

(30) Foreign Application Priority Data

Nov. 30, 2010 (JP) .................................. 2010-267073
Oct. 13, 2011 (JP) .................................. 2011-225617

(51) Int. Cl.
*H01J 37/32*     (2006.01)
*G03F 7/42*     (2006.01)
*H01L 21/311*     (2006.01)

(52) U.S. Cl.
CPC ........ *H01J 37/32458* (2013.01); *G03F 7/427* (2013.01); *H01J 37/321* (2013.01);
(Continued)

(58) Field of Classification Search
CPC ... G03F 7/427; H01J 37/321; H01J 37/32449; H01J 37/32458; H01J 37/32633; H01L 21/31138
See application file for complete search history.

(56) References Cited

U.S. PATENT DOCUMENTS 4,718,976 A * 1/1988 Fujimura ............... C23C 16/452
156/345.33
5,105,761 A * 4/1992 Charlet ............... H01J 37/3244
118/719

(Continued)

FOREIGN PATENT DOCUMENTS

JP    58-170536 A     10/1983
JP    61104625 A * 5/1986 ........... H01L 21/302

(Continued)

OTHER PUBLICATIONS

Abstract of JP61-104625A to Saikai (Year: 1986).*

(Continued)

*Primary Examiner* — Douglas Lee
(74) *Attorney, Agent, or Firm* — Volpe and Koenig, P.C.

(57) ABSTRACT

A conventional substrate processing apparatus for generating plasma cannot generate plasma with high density and thus throughput of substrate processing is low. In order to solve this problem, provided is a substrate processing apparatus including a reaction vessel having a tubular shape and provided with a coil installed at an outer circumference thereof; a cover installed at a first end of the reaction vessel; a gas introduction port installed at the cover; a first plate installed between the gas introduction port and an upper end (Continued)

of the coil; a second plate installed between the first plate and the upper end of the coil; a substrate processing chamber installed at a second end of the reaction vessel; and a gas exhaust part connected to the substrate processing chamber.

10 Claims, 11 Drawing Sheets

(52) U.S. Cl.
CPC .. *H01J 37/32449* (2013.01); *H01J 37/32633* (2013.01); *H01L 21/31138* (2013.01)

(56) References Cited

U.S. PATENT DOCUMENTS

| | | | |
|---|---|---|---|
| 7,745,350 | B2 | 6/2010 | Wang et al. |
| 9,911,580 | B2* | 3/2018 | Yanai .................... H01J 37/321 |
| 2006/0082785 | A1 | 4/2006 | Janos et al. |
| 2008/0268173 | A1 | 10/2008 | White et al. |
| 2009/0071403 | A1 | 3/2009 | Choi et al. |
| 2009/0093124 | A1* | 4/2009 | Hiyama ................. G03F 7/427 438/710 |
| 2010/0012275 | A1 | 1/2010 | Yamashita |
| 2010/0130017 | A1* | 5/2010 | Luo .................... H01J 37/3244 438/710 |

FOREIGN PATENT DOCUMENTS

| | | | |
|---|---|---|---|
| JP | 05-299382 | A | 11/1993 |
| JP | H07-169703 | A | 7/1995 |
| JP | 2001-007083 | A | 1/2001 |
| JP | 2003-077893 | A | 3/2003 |
| JP | 2003-249493 | A | 9/2003 |
| JP | 2005-203209 | A | 7/2005 |
| JP | 2009-094115 | A | 4/2009 |
| JP | 2009-111350 | A | 5/2009 |
| JP | 2010-021244 | A | 1/2010 |
| KR | 10-0777841 | B1 | 11/2007 |
| KR | 2009-0034722 | A | 4/2009 |
| KR | 10-077784 | B1 | 10/2011 |
| TW | 2008-45186 | A | 11/2008 |
| TW | 2008-493336 | A | 12/2008 |
| TW | 2010-28804 | A | 8/2010 |
| TW | 2010-333393 | A | 9/2010 |

OTHER PUBLICATIONS

Machine translation of JP61-104625A to Saikai (Year: 1986).*
Japanese Notification of Reasons of Refusal, JP Application No. 2016-240066, dated Aug. 28, 2017, 7 pages.
Japanese Notification of Reasons of Refusal, JP Application No. 2015-218630, dated Aug. 10, 2016, 7 pages.
Japanese Office Action dated Jan. 23, 2019 for the Japanese Patent Application No. 2018-043765.

* cited by examiner

SUBSTRATE PROCESSING APPARATUS, METHOD OF MANUFACTURING SEMICONDUCTOR DEVICE, AND BAFFLE STRUCTURE OF THE SUBSTRATE PROCESSING APPARATUS

CROSS-REFERENCE TO RELATED PATENT APPLICATION

This U.S. non-provisional patent application is a continuation of U.S. patent application Ser. No. 13/306,277, filed on Nov. 29, 2011, and claims priority under 35 U.S.C. § 119 of Japanese Patent Application No. 2010-267073, filed on Nov. 30, 2010 and Japanese Patent Application No. 2011-225617, filed on Oct. 13, 2011, in the Japanese Patent Office, the entire contents of which are hereby incorporated by reference.

BACKGROUND OF THE INVENTION

1. Field of the Invention

The present invention relates to a substrate processing apparatus for generating plasma and processing a substrate using the plasma, a method of manufacturing a semiconductor device, and a baffle structure used in the substrate processing apparatus.

2. Description of the Related Art

When a semiconductor device is manufactured, various processes are performed using plasma. One method of generating plasma is known as an inductive coupling plasma (ICP) method. In the ICP method, radio frequency power is supplied to a coil to generate an electric field in a plasma generating space so that a gas supplied into the plasma generating space is in a plasma state. A substrate processing apparatus using the ICP method may be, for example, an apparatus disclosed in Patent Document 1.

PRIOR ART DOCUMENT

Patent Document

1. Japanese Patent Laid-open Publication No. 2003-77893

SUMMARY OF THE INVENTION

However, a conventional substrate processing apparatus cannot easily generate plasma with a high density, and as a result, throughput of substrate processing is low.

In order to solve these problems, an object of the present invention is to provide a substrate processing apparatus capable of processing a substrate with high throughput using plasma, a method of manufacturing a semiconductor device, and a baffle structure used in the substrate processing apparatus.

In order to accomplish the above object, the present invention provides a substrate processing apparatus including: a reaction vessel having a tubular shape and provided with a coil installed at an outer circumference thereof; a cover installed at a first end of the reaction vessel; a gas introduction port installed at the cover; a first plate installed between the gas introduction port and an upper end of the coil; a second plate installed between the first plate and the upper end of the coil; a substrate processing chamber installed at a second end of the reaction vessel; and a gas exhaust part connected to the substrate processing chamber.

In addition, the present invention provides a method of manufacturing a semiconductor device using a substrate processing apparatus including: a reaction vessel having a tubular shape and provided with a coil installed at an outer circumference thereof; a cover installed at a first end of the reaction vessel; a gas introduction port installed at the cover; a first plate installed between the gas introduction port and an upper end of the coil; a second plate installed between the first plate and the upper end of the coil; a substrate processing chamber installed at a second end of the reaction vessel; and a gas exhaust part connected to the substrate processing chamber, the method including: inducing a gas introduced through the gas introduction port about the coil via the first and second plates; exciting the gas into a plasma state by the coil and processing the substrate placed in the substrate processing chamber with the gas; and exhausting the gas through the gas exhaust part.

Further, the present invention provides a baffle structure using a substrate processing apparatus including: a reaction vessel having a tubular shape and provided with a coil installed at an outer circumference thereof; a cover installed at a first end of the reaction vessel; a gas introduction port installed at the cover; a substrate processing chamber installed at a second end of the reaction vessel; and a gas exhaust part connected to the substrate processing chamber, the baffle structure comprising: a first plate and a second plate stacked between the gas introduction port and an upper end of the coil.

According to the present invention, substrate processing can be performed with high throughput.

DETAILED DESCRIPTION OF THE PREFERRED EMBODIMENTS

Hereinafter, an exemplary embodiment of the present invention will be described with reference to the accompanying drawings. The present invention relates to, for example, a substrate processing method used in a semiconductor manufacturing apparatus, and more particularly, to a dry ashing process of generating an reactive gas in a plasma state through an ICP method and delaminating a predetermined organic thin film (a resist, a resist film) on a substrate surface by a reactive species (a reactive active species) having high reactivity obtained therefrom.

Figure 1:
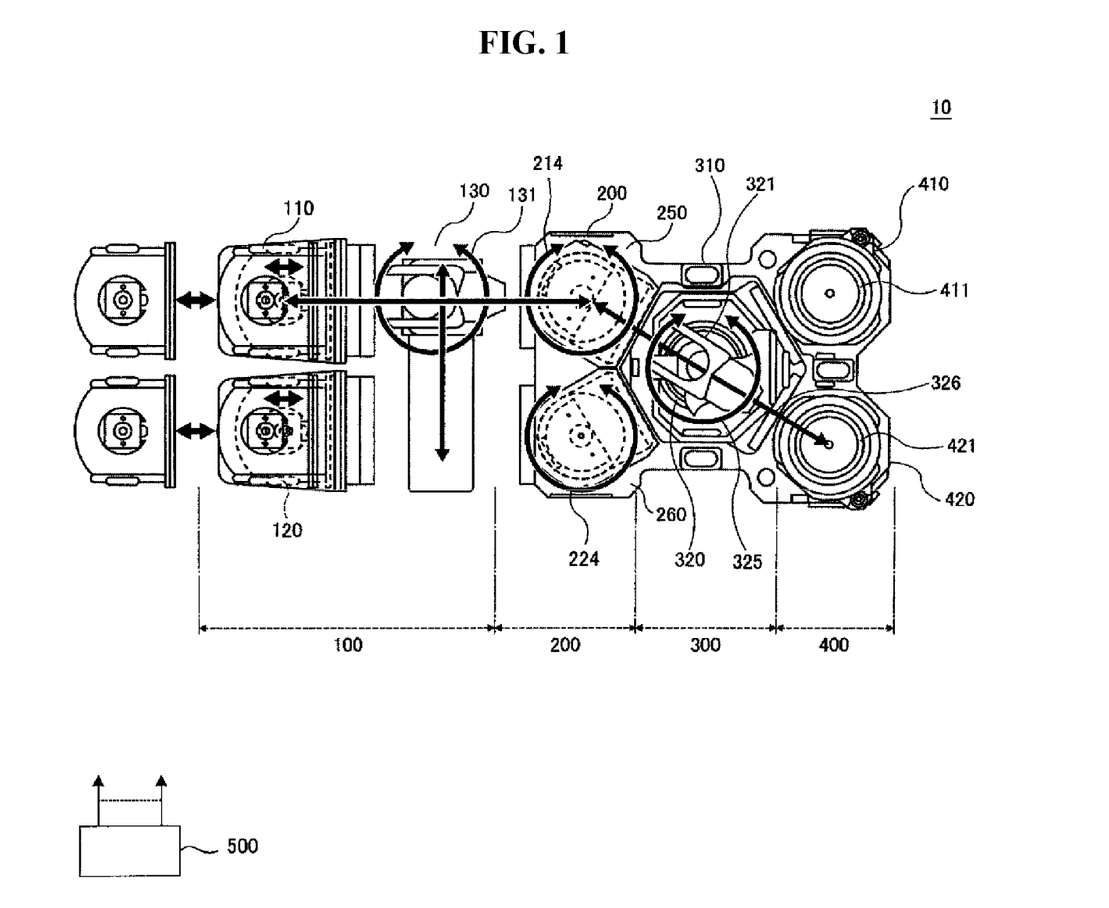
FIG. 1 is a schematic horizontal cross-sectional view for explaining an ashing apparatus in accordance with an exemplary embodiment of the present invention.
Figure 2:
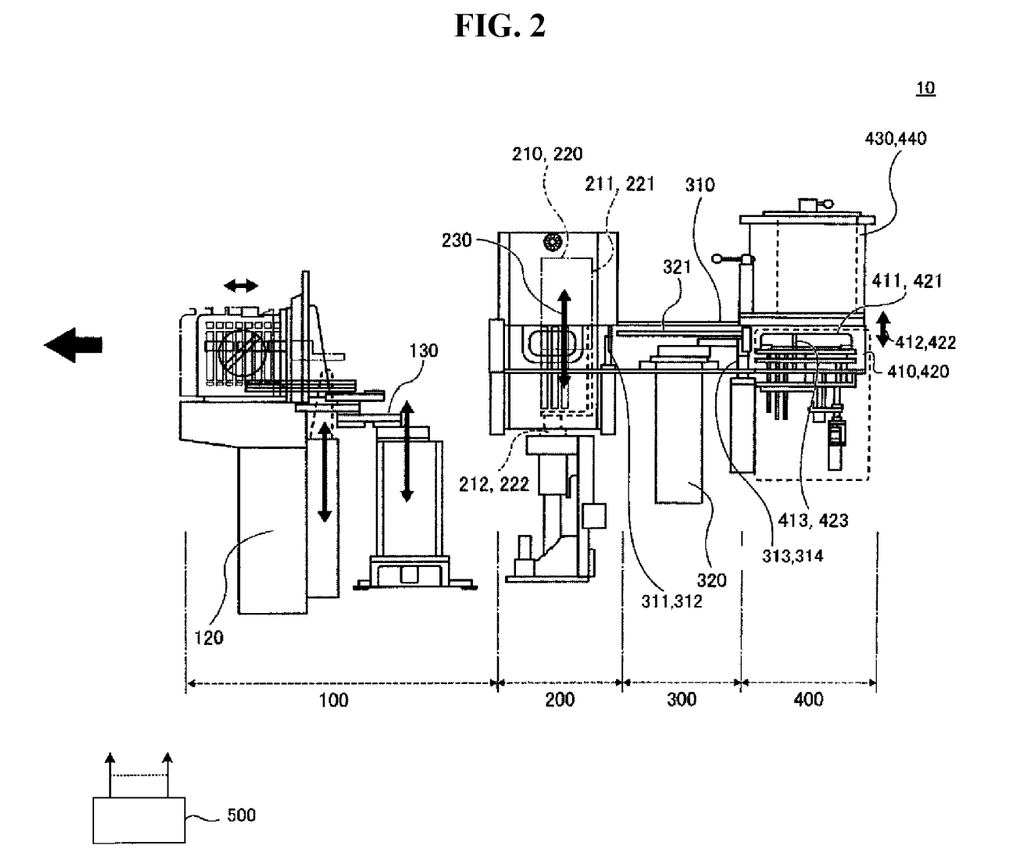
FIG. 2 is a schematic vertical cross-sectional view for explaining the ashing apparatus in accordance with the exemplary embodiment of the present invention.

In the exemplary embodiment of the present invention, a method of manufacturing a semiconductor device and a method of processing a substrate are implemented by an ashing apparatus used as a semiconductor manufacturing apparatus and a substrate processing apparatus. FIG. 1 is a schematic horizontal cross-sectional view for explaining an ashing apparatus in accordance with an exemplary embodiment of the present invention, and FIG. 2 is a schematic vertical cross-sectional view for explaining the ashing apparatus in accordance with the exemplary embodiment of the present invention. As shown in FIGS. 1 and 2, an ashing apparatus 10 includes an equipment front end module (EFEM) 100, a load lock chamber part 200, a transfer module part, and a processing chamber part 400 used as a processing chamber in which ashing processing is performed.

The EFEM 100 includes front opening unified pods (FOUPs) 110 and 120, and an atmospheric robot 130, which is a first conveyance part, configured to convey a wafer to the load lock chamber from each FOUP. 25 wafers are mounted in the FOUP and an arm part of the atmospheric robot 130 extracts 5 wafers from the FOUP.

The load lock chamber part 200 includes load lock chambers 250 and 260, and buffer units 210 and 220 configured to hold the wafers 600 (see FIG. 3) conveyed from the FOUP in the load lock chambers 250 and 260, respectively. The buffer units 210 and 220 include boats 211 and 221 and index assemblies 212 and 222 under the boats. The boat 211 and the index assembly 212 under the boat are simultaneously rotated about a θ axis 214. Similarly, the boat 221 and the index assembly 222 under the boat are also simultaneously rotated about a θ axis 224.

The transfer module part 300 includes a transfer module 310 used as a conveyance chamber, and the load lock chambers 250 and 260 are installed at the transfer module 310 via gate valves 311 and 312. A vacuum arm robot unit 320 used as a second conveyance part is installed at the transfer module 310.

The processing chamber part 400 includes plasma processing units 410 and 420 used as a processing chamber, and plasma generating chambers 430 and 440 installed at an upper part thereof. The plasma processing units 410 and 420 are installed at the transfer module 310 via gate valves 313 and 314.

The plasma processing units 410 and 420 include susceptor tables 411 and 421 on which the wafers 600 are placed. Lifter pins 413 and 423 are installed to pass through the susceptor tables 411 and 421. The lifter pins 413 and 423 move vertically in Z-axis directions 412 and 422.

The plasma generating chambers 430 and 440 include reaction vessels 431 and 441 (see FIG. 3), respectively. Resonance coils, which will be described later, are installed outside the reaction vessels 431 and 441. Radio frequency power is applied to the resonance coils to generate a reactive gas for ashing processing introduced from a gas introduction port, which will be described later, in a plasma state. Resists on the wafers 600 placed on the susceptor tables 411 and 421 are ashing-processed using the plasma (plasma-processed).

In addition, the apparatus includes a controller 500 electrically connected to the components. The controller 500 controls operations of the components.

In the ashing apparatus 10 as configured above, the wafers 600 are conveyed into the load lock chambers 250 and 260 from the FOUPs 110 and 120. At this time, as shown in FIG. 2, the atmospheric robot 130 stores tweezers in a pod of the FOUP and places 5 wafers on the tweezers. Here, according to positions of the extracted wafers in a height direction, the controller 500 moves the tweezers and arm of the atmospheric robot vertically. After placing the wafers on the tweezers, the atmospheric conveyance robot 130 is rotated in a θ axis direction 131, and the wafers are mounted on the boats 211 and 221 of the buffer units 210 and 220, respectively. At this time, as the boats 211 and 221 are operated in a Z-axis direction 230, the boats 211 and 221 receive 25 wafers 600 from the atmospheric conveyance robot 130. After receiving the 25 wafers, the controller 500 operates the boats 211 and 221 in the Z-axis direction such that the wafer disposed at the lowermost layer of the boats 211 and 221 corresponds to a height position of the transfer module part 300.

In the load lock chambers 250 and 260, the wafers 600 held in the load lock chambers 250 and 260 by the buffer units 210 and 220 are mounted on fingers 312 of the vacuum arm robot unit 320. The vacuum arm robot unit 320 is rotated in a θ axis direction 325, and the fingers extend in a Y-axis direction 326 to transfer the wafers onto the susceptor tables 411 and 421 in the plasma processing units 410 and 420.

Here, an operation of the ashing apparatus 10 when the wafers 600 are transferred onto the susceptor tables 411 and 421 from the fingers 321 will be described.

The wafers 600 are transferred onto the susceptor tables 411 and 421 through cooperation of the fingers 321 of the vacuum arm robot unit 320 and the lifter pins 413 and 423. In addition, by means of a reverse operation, the processed wafers 600 are transferred onto the buffer units 210 and 220 in the load lock chambers 250 and 260 from the susceptor tables 411 and 421 by the vacuum arm robot unit 320.

Figure 3:
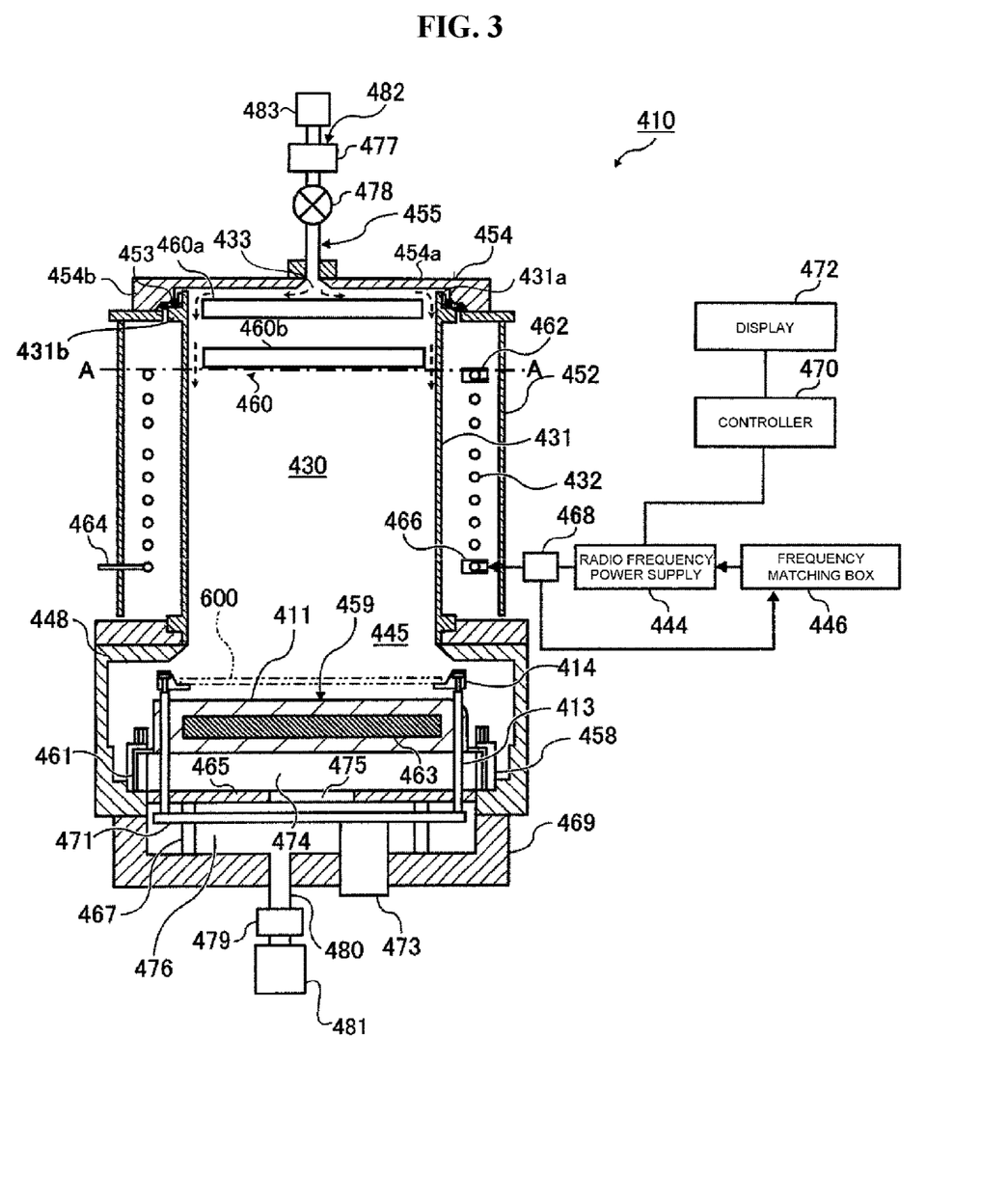
FIG. 3 is a vertical cross-sectional view for explaining a plasma processing unit included in the ashing apparatus in accordance with the exemplary embodiment of the present invention.

FIG. 3 is a view specifically showing the plasma processing unit 410. In addition, the plasma processing unit 420 has the same configuration as the plasma processing unit 410. Further, the susceptor table 421 included in the plasma processing unit 420 has the same configuration as the susceptor table 411.

The plasma processing unit 410 is an ICP type of plasma processing unit that performs ashing of a semiconductor substrate or a semiconductor device through dry processing. As shown in FIG. 3, the plasma processing unit 410 includes a plasma generating chamber 430 configured to generate plasma, a processing chamber 445 configured to accommodate wafers 600 such as a semiconductor substrate, a radio frequency power supply 444 configured to supply radio frequency power to the plasma generating chamber 430 (in particular, a resonance coil 432), and a frequency matching box 446 configured to control an oscillation frequency of the radio frequency power supply 444. For example, the plasma processing unit 420 is configured by disposing the plasma generating chamber 430 on a horizontal base plate 448, which is a cradle, and disposing the processing chamber 445 under the base plate 448. In addition, a spiral resonator is constituted by a resonance coil 432 and an outer shield 452.

The plasma generating chamber 430 is constituted by a reaction vessel 431, which can be decompressed and into which a reactive gas for plasma is supplied, the resonance coil 432 is wound on an outer circumference of the reaction vessel, and the outer shield 452 disposed at an outer circumference of the resonance coil 432 and electrically grounded.

The reaction vessel 431 is a chamber having a tubular shape and formed of high purity quartz glass or ceramics. The reaction vessel 431 is disposed to have a vertical axis, and has upper and lower ends hermetically sealed by a top plate 454 and the processing chamber 445 installed at an opposite side of the top plate 454. The top plate 454 is supported by a flange 431b of the reaction vessel 431 and an upper end of the outer shield 452.

The top plate 454 includes a cover 454a configured to block one end of the reactive vessel 431, and a support 454b configured to support the cover 454a. The cover 454a is an inner surface from a portion in contact with a front end 431a in a radial direction, and the support 454b is a portion supported by the flange 431b and the outer shield 452. A gas introduction port 433 is installed substantially at a center of the cover 454a. An O-ring 453 is installed at an outer circumference of the front end 431a between the flange 431b and the support 454b to hermetically seal the plasma generating chamber 430.

A susceptor 459 supported by a plurality of (for example, 4) columns 461 is installed at a bottom surface of the processing chamber 445 under the reaction vessel 431. A heater 463, which is a heating part configured to heat the susceptor table 411 and the wafer on the susceptor, is installed at the susceptor 459. An exhaust plate 465 is disposed under the susceptor 459. The exhaust plate 465 is supported by a bottom plate 469 via a guide shaft 467, and the bottom plate 469 is hermetically installed at a lower surface of the processing chamber 445. An elevation plate 471 is installed to elevate the guide shaft 467 as a guide. The elevation plate 471 supports at least three lifter pins 413.

As shown in FIG. 3, the lifter pin 413 passes through the susceptor table 411 of the susceptor 459. In addition, a support 414 configured to support the wafer 600 is installed at an apex of the lifter pin 413. The support 414 extends in a center direction of the susceptor 459. As the lifter pin 413 is elevated, the wafer 600 is placed on the susceptor table 411, or raised from the susceptor table 411. An elevation shaft 473 of an elevation drive part (not shown) is connected to the elevation plate 471 via the bottom plate 469. As the elevation drive part elevates the elevation shaft 473, the support 414 is raised via the elevation plate 471 and the lifter pin 413. In addition, in FIG. 3, the lifter pin 413 is shown in a state in which the support part 414 is installed.

A baffle ring 458 is installed between the susceptor 459 and the exhaust plate 465. A first exhaust chamber 474 is defined by the baffle ring 458, the susceptor 459 and the exhaust plate 465. The baffle ring 458 having a cylindrical shape has a plurality of vent holes, which are uniformly installed. Accordingly, the first exhaust chamber 474 is distinguished from a processing space of the processing chamber 445. In addition, the first exhaust chamber 474 is in communication with the processing space by the vent holes. Here, the processing space refers to a space in which a substrate is processed.

An exhaust communication hole 475 is installed in the exhaust plate 465. The first exhaust chamber 474 is in communication with a second exhaust chamber 476 by the exhaust communication hole 475. An exhaust pipe 480 is in communication with the second exhaust chamber 476, and a pressure regulation valve 479 and an exhaust pump 481 are installed at the exhaust pipe 480 from an upstream side thereof. A gas exhaust part is constituted by the exhaust pipe 480, the pressure regulation valve 479 and the exhaust pump 481. The gas exhaust part is connected to the processing chamber 445 via the second exhaust chamber 476.

On the top plate 454 at an upper part of the reaction vessel 431, a gas supply pipe 455 extending from a gas supply unit 482 and configured to supply a reactive gas for plasma is installed at the gas introduction port 433. The gas introduction port 433 has a conical shape, a diameter of which is increased as it approaches the processing chamber. The gas supply unit (a gas supply part) 482 includes a gas source 483, a mass flow controller 477, which is a flow rate control unit, and an opening/closing valve 478, in sequence from an upstream side thereof. The gas supply unit 482 controls the mass flow controller 477 and the opening/closing valve 478 to control a gas supply amount.

In addition, a pressure in the processing chamber 445 is regulated by adjusting a supply amount and an exhaust amount of the gas using the mass flow controller 477 and the pressure regulation valve 479.

Figure 4A:
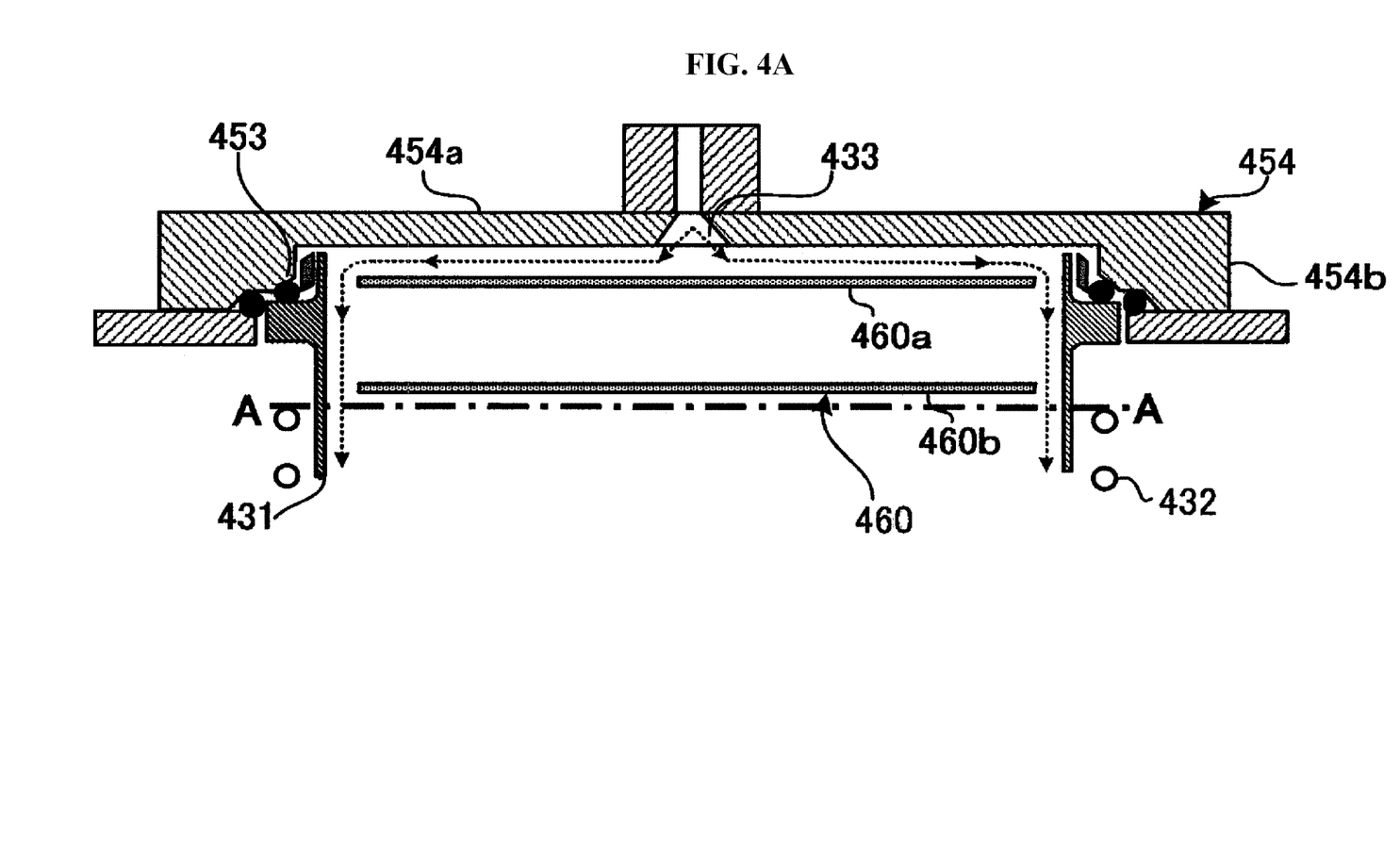
FIGS. 4A and 4B are vertical cross-sectional views for explaining a baffle plate of the plasma processing unit included in the ashing apparatus in accordance with the exemplary embodiment of the present invention.
Figure 4B:
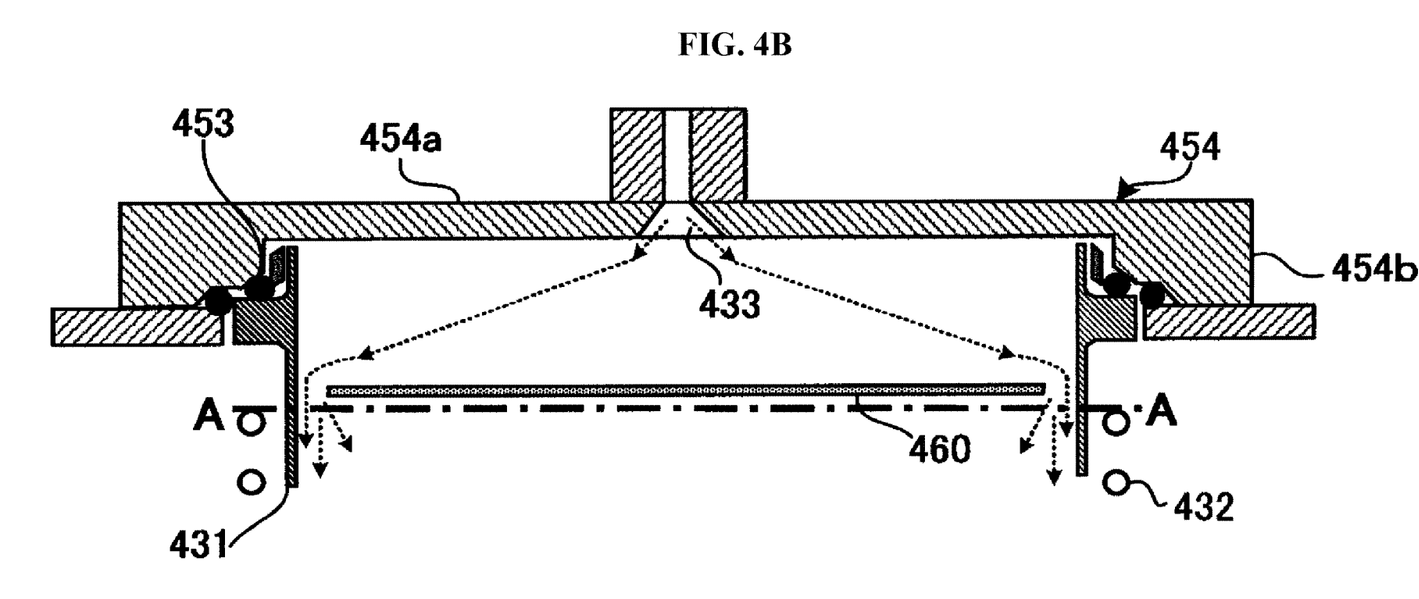

FIG. 4A shows surroundings of a baffle plate 460 in accordance with an exemplary embodiment of the present invention, and FIG. 4B shows surroundings of the baffle plate 460 according to Comparative example.

As shown in FIG. 4A, the baffle plate 460 in accordance with an exemplary embodiment of the present invention includes a first baffle plate 460a and a second baffle plate 460b, which are formed of, for example, quartz. The first baffle plate 460a is disposed in the reaction vessel 431 and installed between an upper end of the resonance coil 432 and the gas introduction port 433. In addition, the second baffle plate 460b is installed between the first baffle plate 460a and the upper end of the resonance coil 432. That is, the first baffle plate 460a and the second baffle plate 460b are installed between the upper end of the resonance coil 432 and the gas introduction port 433 via a space to overlap each other. In addition, the first baffle plate 460a and the second baffle plate 460b are installed between the susceptor table 411 and the gas introduction port 433.

In addition, the first baffle plate 460a and the second baffle plate 460b have substantially the same plate shape with no hole. Further, the plates have a shape conforming to an inner circumference of the reaction vessel 431. That is, when the inner circumference of the reaction vessel 431 has a circular shape, ends of the baffle plates also have a circular shape. In other words, the baffle plates are configured to form a disc shape along the inner circumference of the reaction vessel 431.

According to the above configuration, a flow path of a gas flowing between the top plate 454 and the first baffle plate 460a and a flow path of a gas flowing between the reaction vessel 431 and the end of the baffle plate along the inner circumference of the reaction vessel 431 are formed. Since a gas supplied from the gas introduction port 433 is supplied via the gas flow paths, the gas supplied to the center of the reaction vessel 431 is not concentrated. That is, since the gas is supplied via the first baffle plate 460a and the second baffle plate 460b, as shown in dotted arrows of FIG. 4A, gas flows are generated, and the gas is substantially vertically dropped at an upper end side of the resonance coil 432. Accordingly, there is no loss of the gas.

Meanwhile, as shown in FIG. 4B, the baffle plate 460 in accordance with Comparative example is constituted by one baffle plate 460. In the baffle plate 460 in accordance with Comparative example, as shown in dotted arrows in FIG. 4B, a gas flow path is formed toward an outer circumference of the baffle plate 460 from the gas introduction port 433 in an inclined direction, and the gas is diffused at an upper end side (line A-A of FIG. 4B) of the resonance coil 432. That is, since the gas is diffused into a region having low electrolysis intensity, weak plasma is generated.

Here, in the case of ICP type plasma generating apparatus, an electric field for generating plasma is known to be strong as it approaches the resonance coil 432. Accordingly, as the gas is concentrated in a place having a strong electric field adjacent to the resonance coil 432, plasma generating efficiency may be increased. In addition, plasma with high energy and long lifespan is generated in such a place. That is, as at least two baffle plates 460a and 460b are installed, as shown in arrows, the gas flows along an inner wall of the reaction vessel 431 adjacent to the resonance coil, and the gas is concentrated in the place having a strong electric field adjacent to the resonance coil 432, increasing the plasma generating efficiency. In addition, plasma with high energy and long lifespan is generated in such a place.

Figure 5A:
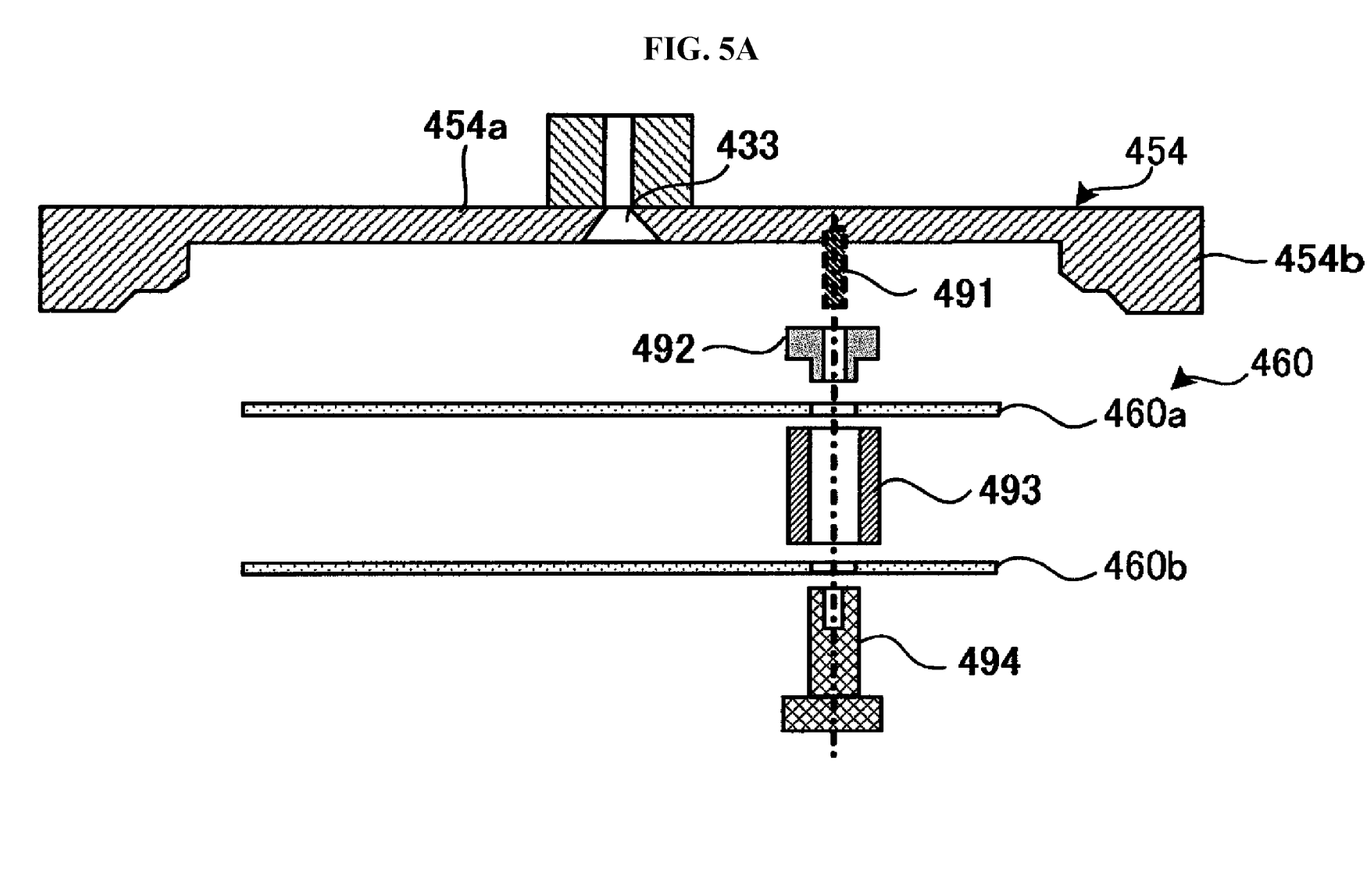
FIGS. 5A and 5B are vertical cross-sectional views for explaining an attachment structure of the baffle plate of the plasma processing unit included in the ashing apparatus in accordance with the exemplary embodiment of the present invention.
Figure 5B:
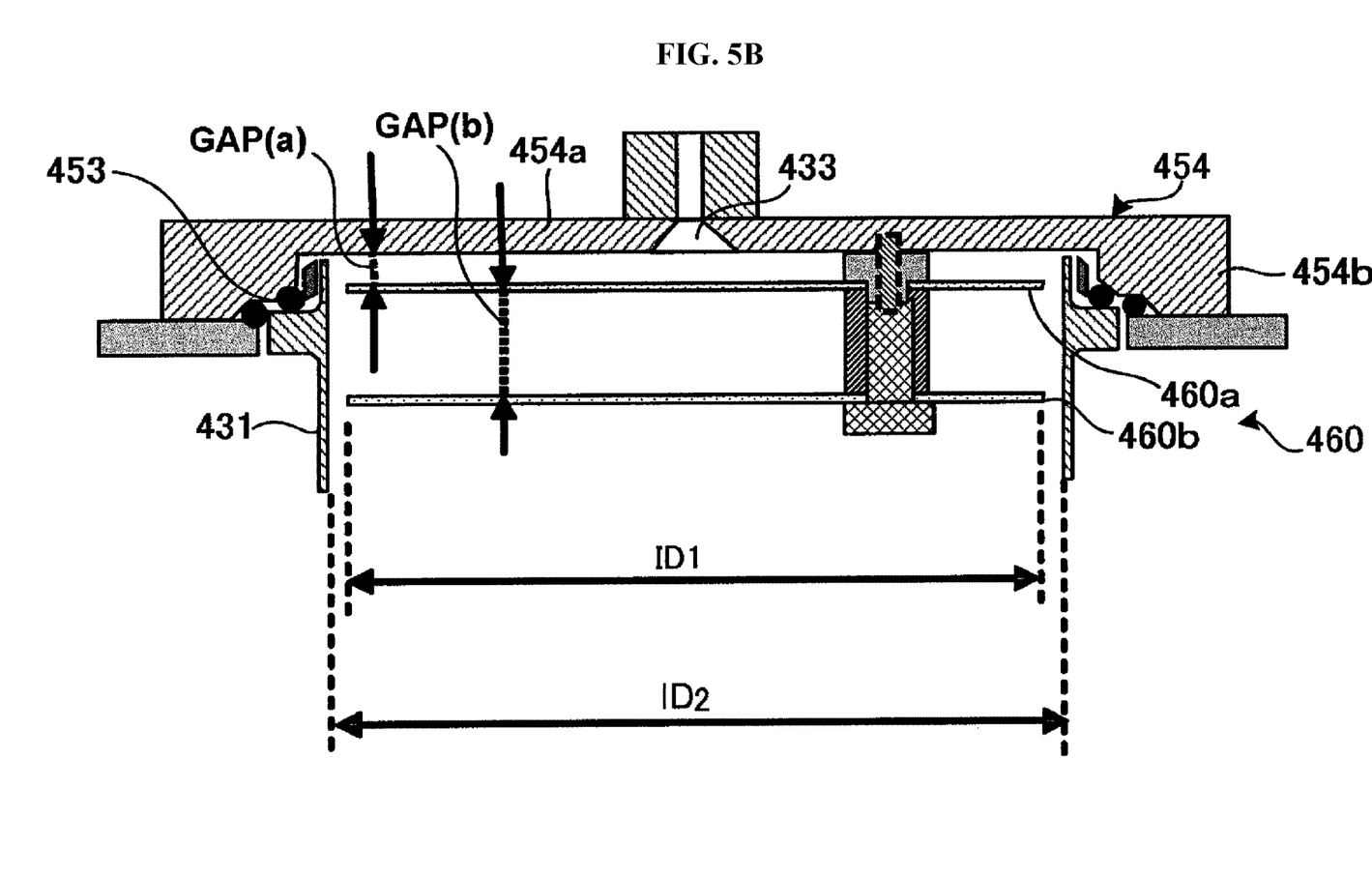

Next, an attachment structure of the baffle plates 460a and 460b will be described with reference to FIG. 5. FIG. 5 is an enlarged view of the baffle plates 460a and 460b and the top plate 454, explaining the attachment structure of the baffle plates 460a and 460b. First, a fixing mechanism will be described with reference to FIG. 5A. A bolt 491 inserted into the top plate 454 is sequentially inserted into a first collar 492 having a hole formed at its center, a fixing hole formed in the first baffle plate 460a, a second collar 493 having a hole formed at its center, and a fixing hole formed in the second baffle plate 460b, and fixed by a fixing bolt 494. The first collar 492 is formed of a metal material (for example, an aluminum alloy), and the top plate 454 and the first collar 492 are configured to be grounded. At least three fixing mechanisms are installed in a circumferential direction of the baffle plate 460 at predetermined intervals.

Next, a positional relationship between the baffle plates 460a and 460b, the top plate 454 and the reaction vessel 431 will be described with reference to FIG. 5B. As shown in FIG. 5B, a distance between the cover 454a of the top plate 454 and a surface of the first baffle plate 460a facing the cover 454a is referred to as GAP(a). GAP(a) is set to a range of 1 mm to 5 mm, preferably, 2 mm to 4 mm. A distance between facing surfaces of the first baffle plate 460a and the second baffle plate 460b is referred to as GAP(b). GAP(b) is set to a range of 30 mm to 50 mm. A distance between an outer circumference of the baffle plate 460 and an inner circumference of the reaction vessel 431 is 0.1 to 10 mm. Specifically, the baffle plate has a diameter of 269 mm, which is smaller than a diameter of the substrate, and the reaction vessel 431 has an inner diameter of 275 mm.

A distance between the first baffle plate 460a and the gas introduction port 433 is set such that abnormal discharge does not occur between the first baffle plate 460a and the cover 454a, in particular, abnormal discharge does not occur around the gas introduction port 433.

Here, abnormal discharge refers to the following phenomenon. When Ar gas is added to a process gas to enable easy discharge, discharge occurs between the first baffle plate 460a and the cover 454a due to influence of an electric field generated from the resonance coil 432. In particular, since the process gas may easily stop at a region around the gas introduction port 433, the discharge may easily occur. The discharge may be caused by addition of Ar gas. Since the Ar gas has a property of promoting the discharge, the process gas may be discharged even at a distance in which the electric field generated from the resonance coil is weak.

In the case of the discharge, the following problems may occur. First, since the plasma generated around the gas introduction port 433 enters the gas supply pipe 455, the gas supply pipe 455 may be etched. The etching may cause generation of particles. In particular, when the gas supply pipe 455 is made of a metal material, the processing chamber 445 may be contaminated with the metal material and exert bad effects on the substrate processing. Second, the plasma generated between the first baffle plate 460a and the cover 454a may contact the O-ring 453, accelerating deterioration of the O-ring 453.

In order to suppress the discharge, the inventors have researched and found that the discharge is suppressed by increasing a flow velocity of the process gas. Specifically, the distance between the first baffle plate 460a and the cover 454a is reduced. As a result, a pressure between the first baffle plate 460a and the cover 454a can be increased, and thus, the flow velocity of the gas can be increased.

Next, a positional relationship between the second baffle plate 460b and the resonance coil 432 will be described. The second baffle plate 460b is positioned such that a surface of the second baffle plate 460b facing the susceptor table 411 is disposed higher than an upper end (line A-A) of the resonance coil 432. In other words, the second baffle plate 460b is configured to be disposed between the upper end of the resonance coil 432 and the first baffle plate 460a. As a result, since the gas flows around the resonance coil 432, the plasma can be efficiently generated. In addition, diffusion and deactivation of the plasma can be prevented such that as large an amount of active reactive species as possible can be supplied to the wafer disposed at a downstream side. As the second baffle plate 460b approaches the upper end of the resonance coil 432, a volume of the plasma generating region can be reduced, and plasma density per unit volume can be increased. Accordingly, as large an amount of active reactive species as possible can be transported to the downstream side. The baffle structure is configured as described above.

Figure 6A:
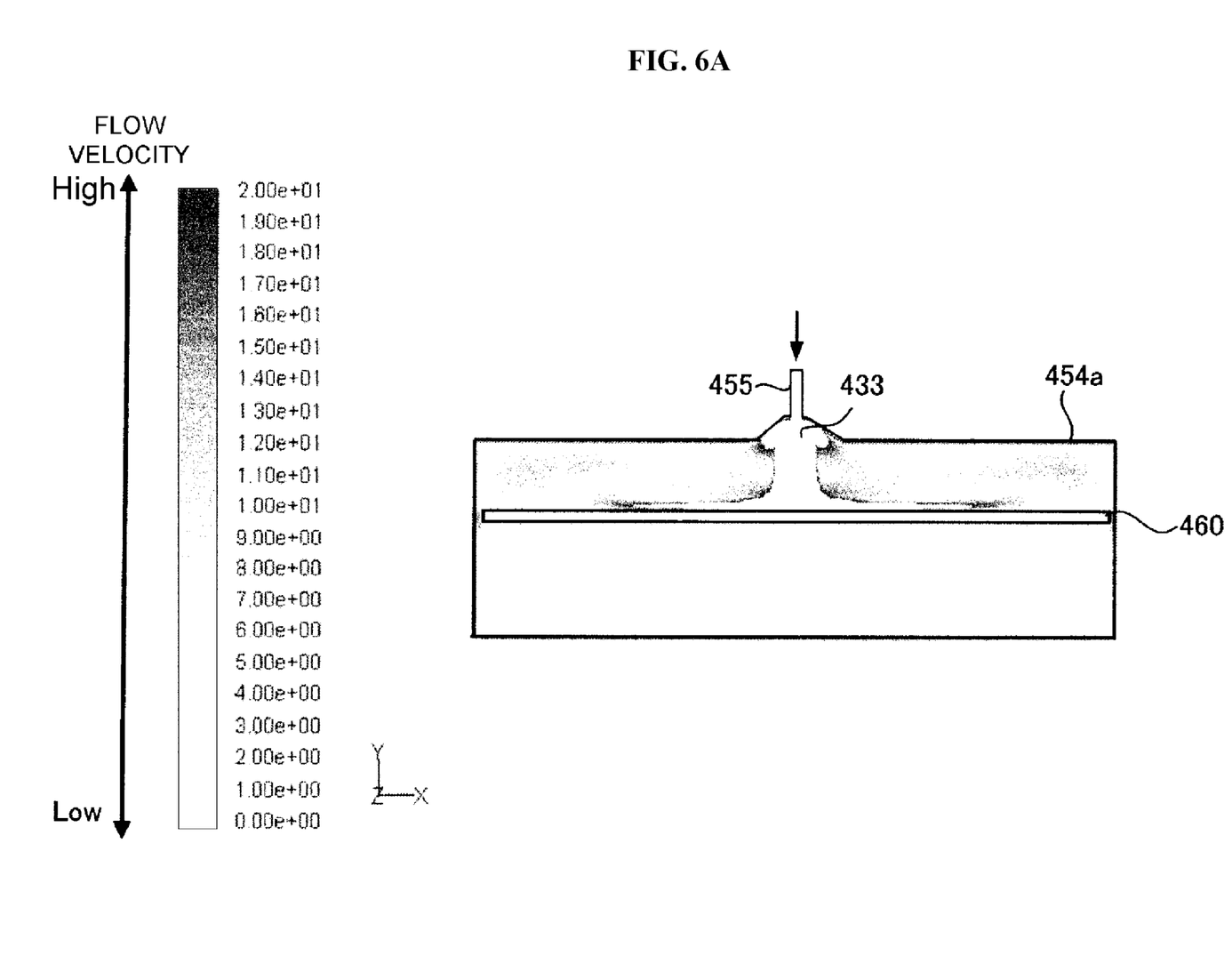
FIGS. 6A and 6B are vertical cross-sectional views for explaining a gas flow velocity of the plasma processing unit included in the ashing apparatus in accordance with the exemplary embodiment of the present invention.
Figure 6B:
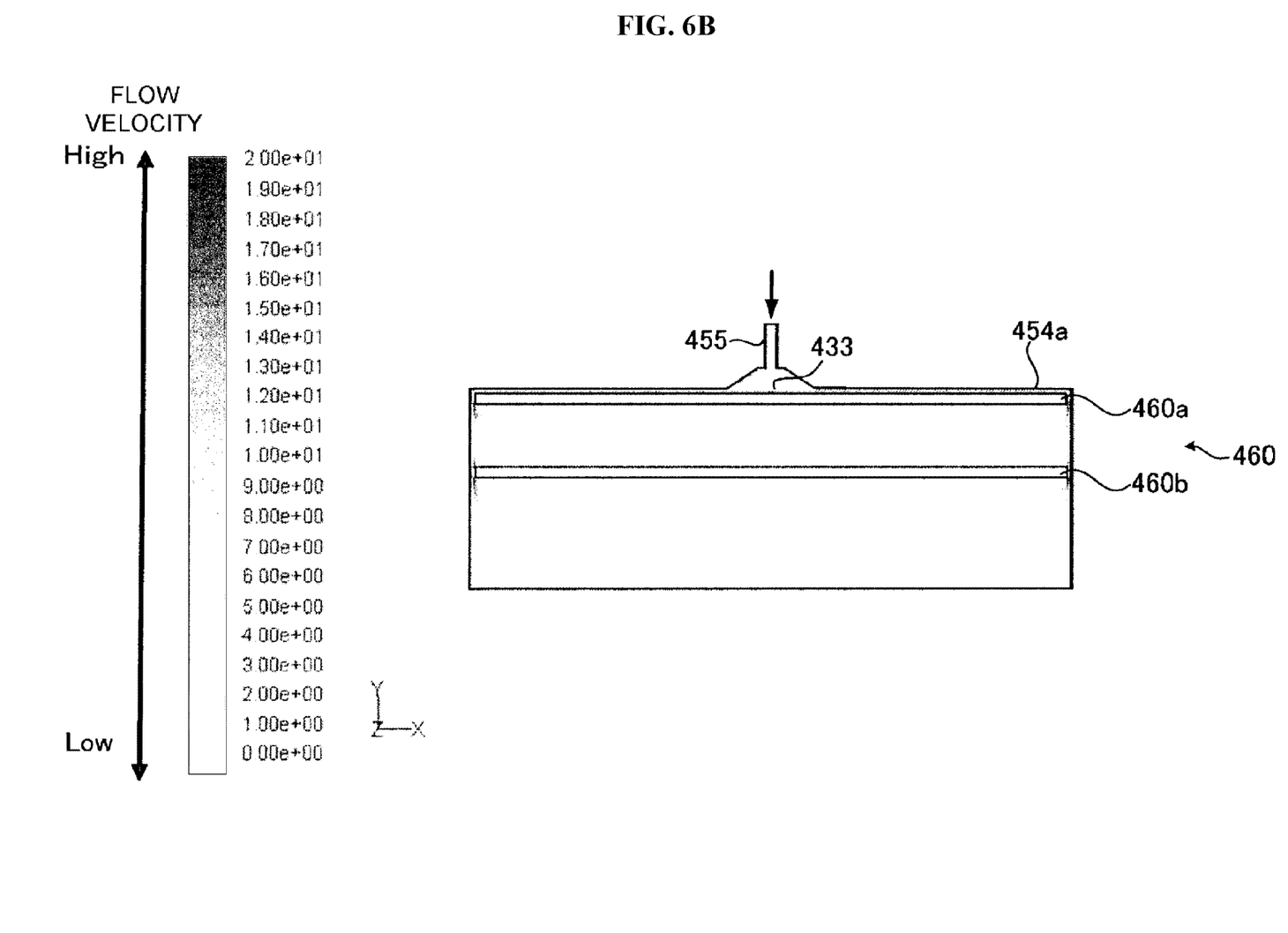

Here, the flow velocity of the gas will be described with reference to FIG. 6. FIG. 6 is a distribution view of a flow velocity. FIG. 6A shows an example using the baffle plate 460 according to Comparative example, in which one baffle plate is set. FIG. 6B shows an example using the baffle plates 460 according to the embodiment, in which two baffle plates 460a and 460b are set. In Comparative example using one baffle plate 460, it will be appreciated that the flow velocity is low around the gas introduction port 433 and high between the baffle plate 460 and the cover 454a. In addition, it will be appreciated that the gas stays in a vortex shape. Accordingly, it may be assumed that the gas is abnormally discharged between the baffle plate 460 and the cover 454a. On the other hand, in the example using two baffle plates 460 in accordance with the embodiment, it will be appreciated that, since the gas does not stay between the first baffle plate 460a and the cover 454a, the discharge can be suppressed.

Figure 7:
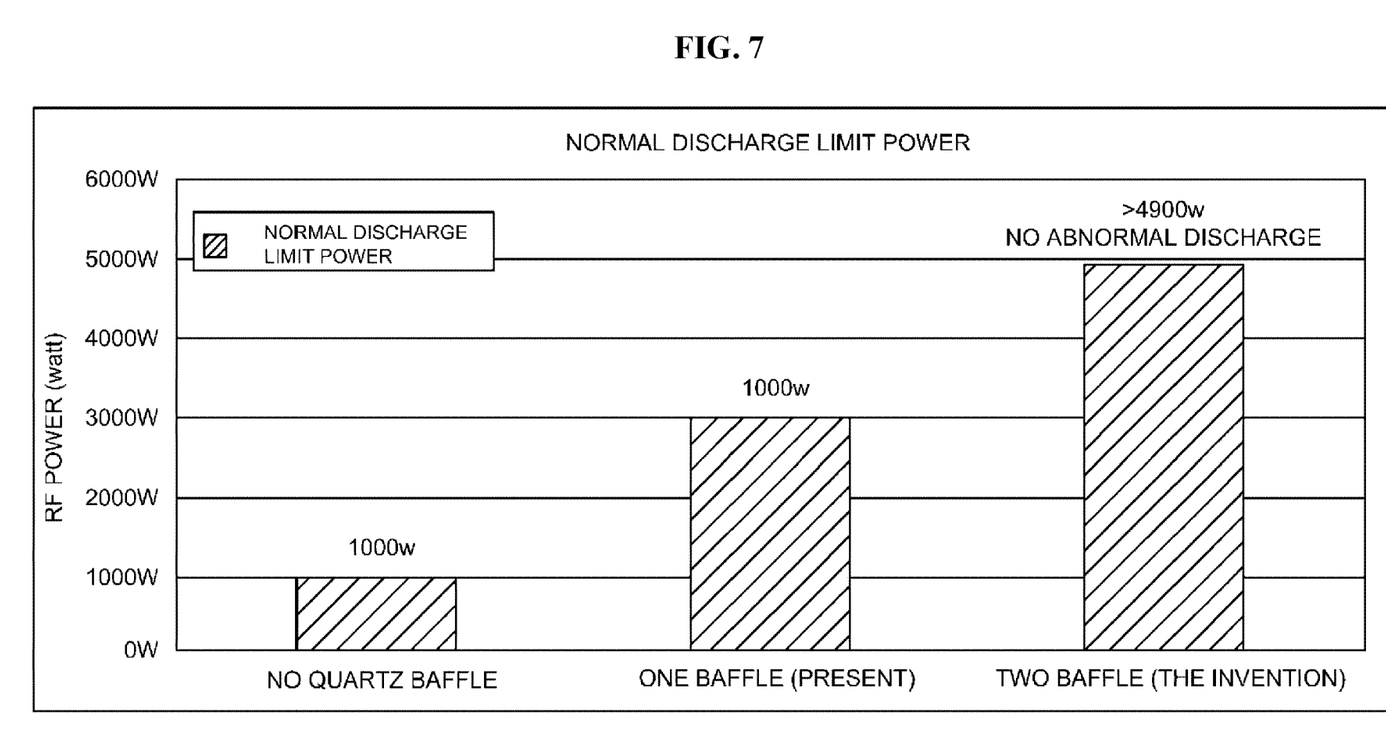
FIG. 7 is a view for explaining normal discharge limit power.

FIG. 7 is a view showing a relationship between RF power, the baffle plate 460 and the discharge. A vertical axis represents RF power applied to the resonance coil 432. In states in which there is no baffle plate 460, one baffle plate 460 is provided and two baffle plates 460 are provided, normal discharge limit power was measured, respectively. The normal discharge limit power means power that abnormal discharge does not occur. Process conditions in these states are as follows. Atmosphere: PR-GAS ($CH_4$: 10%, Ar: 90%), flow rate: 0.2-3.0 slm, and pressure: 50-250 mTorr.

As can be seen from the drawing, in a state in which there is no baffle plate 460, normal discharge up to 1000 W is possible. In addition, in a state in which one baffle plate 460 is provided, normal discharge up to 3000 W is possible. Further, in a state in which two baffle plates 460 are provided, normal discharge up to 4900 W is possible.

In the case of the ICP type plasma generating apparatus, since the plasma state can be efficiently accomplished as the RF power is increased, the RF power may be preferably high as long as the abnormal discharge does not occur. Accordingly, the case of two baffle plates may be more preferable than the case of no baffle plate or one baffle plate.

A winding diameter, a winding pitch, and the number of windings of the resonance coil 432 are set such that the resonance coil 432 is resonated in a certain wavelength mode to form a predetermined wavelength of standing waves. That is, an electrical length of the resonance coil 432 is set to a length corresponding to an integer number of times (one time, two times, . . . ) a wavelength of a predetermined frequency of power supplied from the radio frequency power supply 444, a half wavelength or a ¼ wavelength. For example, the length of one wavelength is about 22 m in the case of 13.56 MHz, about 11 m in the case of 27.12 MHz, and about 5.5 m in the case of 54.24 MHz. The resonance coil 432 is formed of an insulating material to have a disc shape, and supported by a plurality of supports vertically installed at an upper end surface of the base plate 448.

While both ends of the resonance coil 432 are electrically grounded, at least one end of the resonance coil 432 is grounded via a movable tab 462 to minutely adjust the electrical length of the resonance coil when the apparatus is initially installed or the process conditions are varied. Reference numeral 464 of FIG. 3 represents a fixed ground of the other end. In addition, in order to minutely adjust an impedance of the resonance coil 432 when the apparatus is initially installed or the process conditions are varied, a power feeding part is constituted by a movable tab 466 between both of the grounded ends of the resonance coil 432.

That is, the resonance coil 432 includes ground parts electrically grounded and formed at both ends thereof, and the power feeding part configured to receive power from the radio frequency power supply 444 and installed between the ground parts. At least one ground part is a variable ground part, a position of which can be adjusted, and the power feeding part is constituted by a variable power feeding part, a position of which can be adjusted. When the resonance coil 432 includes the variable ground part and the variable power feeding part, as described below, the process conditions may be more conveniently adjusted by adjusting a resonance frequency and a load impedance of the plasma generating chamber 430.

The outer shield 452 is installed to shield leakage of electronic waves to the outside of the resonance coil 432 and form a capacitance element needed to constitute a resonance circuit between the resonance coil 432 and the outer shield 453. The outer shield 452 is generally formed of a conductive material such as an aluminum alloy, copper or a copper alloy in a cylindrical shape. The outer shield 452 is disposed to be spaced, for example, 5 to 150 mm from an outer circumference of the resonance coil 432.

An RF sensor 468 is installed at an output side of the radio frequency power supply 444 to monitor traveling waves, reflected waves, and so on. The reflected wave power monitored by the RF sensor 468 is input into the frequency matching box 446. The frequency matching box 446 controls a frequency to minimize the reflected waves.

The controller 470 corresponds to the controller 500 of FIG. 1, and controls the entire ashing apparatus 10 as well as the radio frequency power supply 444. A display 472, which is a display part, is connected to the controller 470. The display 472 displays data detected by various detection parts installed at the ashing apparatus 10, for example, a monitored result of the reflected wave by the RF sensor 468.

For example, in the case that the process conditions are varied (gas species are increased, and so on) during plasma processing when the ashing process is performed or the plasma is generated before the ashing process, a gas flow rate, a gas mixing ratio and a pressure may be varied to change the load impedance of the radio frequency power supply 444. Even in this case, since the ashing apparatus 10 includes the frequency matching box 446, the oscillation frequency of the radio frequency power supply 444 may be adjusted by following variation in the gas flow rate, the gas mixing ratio and the pressure.

Specifically, the following operations are performed. When the plasma is generated, the plasma converges at the resonance frequency of the resonance coil 432. At this time, the RF sensor 468 monitors the reflected waves from the resonance coil 432 and transmits the level of the monitored reflected waves to the frequency matching box 446. The frequency matching box 446 adjusts the oscillation frequency of the radio frequency power supply 444 such that the reflected waves of the reflected wave power are minimized.

Figure 8:
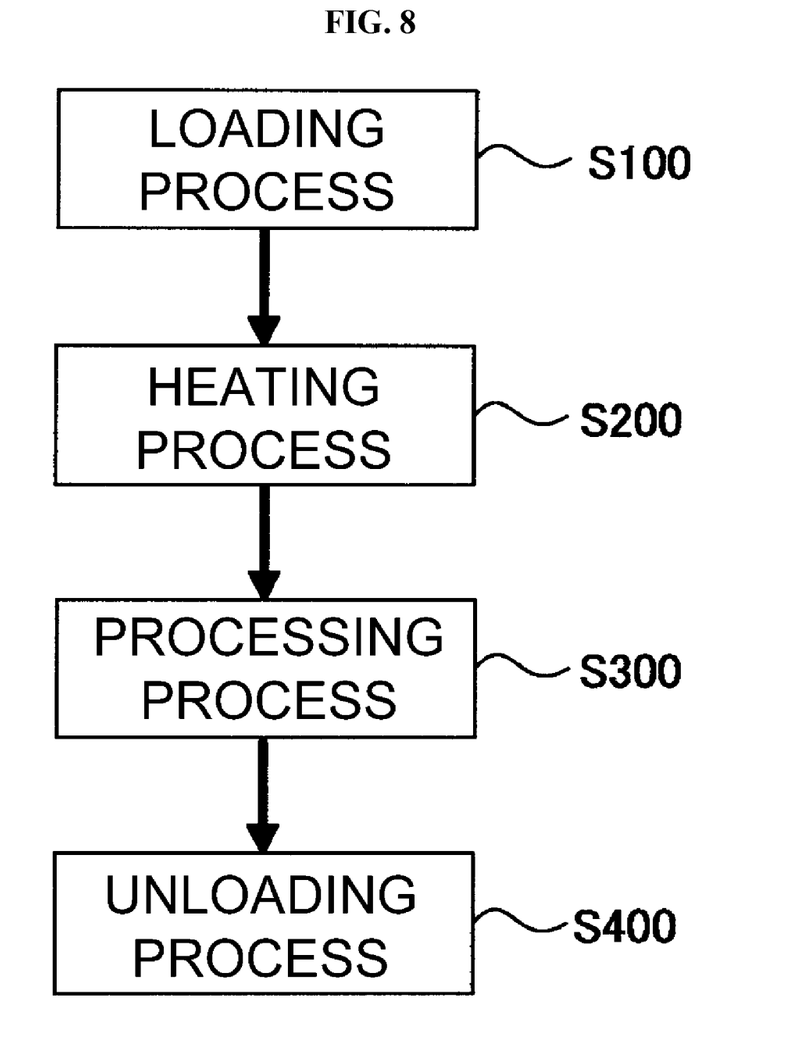
FIG. 8 is a flowchart performed in the plasma processing unit included in the ashing apparatus in accordance with the exemplary embodiment of the present invention.

Next, a method of manufacturing a semiconductor using a substrate processing method (a photo resist removing method) of the present invention as one process will be described with reference to FIG. 8. FIG. 8 illustrates a process of manufacturing a semiconductor device using a substrate processing method and an ashing apparatus 10 of the present invention.

FIG. 8 illustrates a substrate processing method in accordance with an exemplary embodiment of the present invention as a process of processing a substrate (wafer) 600 using the ashing apparatus 10. In the substrate processing method in accordance with the present invention, as shown in FIG. 8, the substrate is processed through a series of processes at least including a loading process (S100) of loading the substrate into a processing chamber, a heating process (S200) of heating the substrate, a processing process (S300) of supplying a reactive gas to process the substrate, and an unloading process (S400) of unloading the substrate from the processing chamber.

In the loading process (S100), a wafer 600 on which a resist is applied is loaded into a processing chamber 445. In the heating process (S200), the wafer 600 loaded into the processing chamber 445 during the loading process (S100) is heated. In the processing process (S300), a reactive gas containing at least a hydrogen element and an argon element is supplied into the processing chamber 445. For example, PR-GAS (a mixed gas of $CH_4$ and argon) is supplied. In addition, the reactive gas supplied into the processing chamber reaches a plasma state to process the wafer 600. In the unloading process (S400), the processed wafer 600 is unloaded from the processing chamber 445.

Hereinafter, an example of the substrate processing using the ashing apparatus 10 will be described in detail. Operations of the respective parts of the ashing apparatus 10 are controlled by a controller 470.

<Loading Process (S100)> In the loading process (S100), fingers 321 of a vacuum arm robot 320 convey the wafer 600 into the processing chamber 445. That is, the fingers 321 on which the wafer 600 is mounted enter the processing chamber 445, and place the wafer 600 onto a raised lifter pin 413. A front end of the lifter pin 413 is maintained in a floating state from a susceptor table 411. The wafer 600 is delivered onto the lifter pin 413 while floating on the susceptor table 411. At this time, the wafer 600 is held at, for example, room temperature.

<Heating Process (S200)> In the heating process (S200), the wafer 600 is held in a floating state from the susceptor table 411, and heated by a heater 463 of the susceptor table 411. A temperature of the wafer is controlled by a distance between the susceptor table 411 and the wafer 600. In the heating process (S200), the temperature of the wafer 600 is within a range of 200° C. to 400° C.

<Processing Process (S300)> In the processing process (S300) of supplying a reactive gas, the reactive gas (ashing gas) is supplied into a plasma generating chamber 430 (into a reaction vessel 431) through a gas introduction port 433. The supplied reactive gas includes at least a hydrogen element and an argon element.

After satisfying predetermined conditions in the processing chamber 445, the supplied reactive gas reaches a plasma state by a resonance coil 432. That is, after supplying the reactive gas in the process of supplying the reactive gas, a radio frequency power supply 444 supplies power to the resonance coil 432 and accelerates free electrons using an inductive magnetic field excited in the resonance coil 432 to collide the free electrons with gas molecules, exciting the gas molecules to generate plasma. Then, the substrate processing is performed by the reactive gas in the plasma state, and the resist is removed.

In this embodiment, a reactive gas containing at least a hydrogen element and an argon element is supplied as the reactive gas used in the processing process (S300). Here, while the Ar gas is used, more specifically, a gas formed by adding at least one dilution gas selected from the group consisting of $N_2$ gas and He gas to hydrogen may be used.

<Unloading Process (S400)> In the unloading process (S400), after completion of the ashing processing process, the lifter pin 413 is raised. The fingers 321 of the vacuum arm robot 320 raise the processed wafer 600 on the lifter pin 413 to convey the wafer 600 to a load lock chamber 210 or a load lock chamber 220 via a transfer chamber part 310.

While the embodiment exemplarily illustrates the ashing processing, the present invention is not limited thereto but may be performed in the processing using plasma such as etching processing, film modification processing, and film-forming processing.

In addition, while the embodiment exemplarily illustrates an example using two baffle plates, the present invention is not limited thereto but a plurality of baffle plates may be used between an upper end of a coil and a gas introduction port.

As described above, since a gas can flow along an inner wall of the reaction vessel 431, the gas can be supplied into a strong electric field region and plasma generating efficiency can be increased. In addition, plasma with high energy and long lifespan can be generated. Accordingly, the process can be performed at a high ashing rate, and thus, throughput of the entire apparatus can be increased.

The present invention is as described in the following claims and includes the following Supplementary Notes.

<Supplementary Note 1>

A substrate processing apparatus including: a reaction vessel having a tubular shape and provided with a coil installed at an outer circumference thereof; a cover installed at a first end of the reaction vessel; a gas introduction port installed at the cover; a first plate installed between the gas introduction port and an upper end of the coil; a second plate installed between the first plate and the upper end of the coil; a substrate processing chamber installed at a second end of the reaction vessel; and a gas exhaust part connected to the substrate processing chamber.

<Supplementary Note 2>

The substrate processing apparatus according to Supplementary Note 1, further including an O-ring installed at an outer circumference of a front end of the reaction vessel.

<Supplementary Note 3>

A method of manufacturing a semiconductor device using a substrate processing apparatus including: a reaction vessel having a tubular shape and provided with a coil installed at an outer circumference thereof; a cover installed at a first end of the reaction vessel; a gas introduction port installed at the cover; a first plate installed between the gas introduction port and an upper end of the coil; a second plate installed between the first plate and the upper end of the coil; a substrate processing chamber installed at a second end of the reaction vessel; and a gas exhaust part connected to the substrate processing chamber, the method including: inducing a gas introduced through the gas introduction port about the coil via the first and second plates; exciting the gas into a plasma state by the coil and processing the substrate placed in the substrate processing chamber with the gas; and exhausting the gas through the gas exhaust part.

<Supplementary Note 4>

A baffle structure using a substrate processing apparatus including: a reaction vessel having a tubular shape and provided with a coil installed at an outer circumference thereof; a cover installed at a first end of the reaction vessel; a gas introduction port installed at the cover; a substrate processing chamber installed at a second end of the reaction vessel; and a gas exhaust part connected to the substrate processing chamber, the baffle structure comprising: a first plate and a second plate stacked between the gas introduction port and an upper end of the coil.

<Supplementary Note 5>

A baffle structure using a substrate processing apparatus including: a reaction vessel having a tubular shape and provided with a coil installed at an outer circumference thereof; a cover installed at a first end of the reaction vessel; a gas introduction port installed at the cover; a substrate processing chamber installed at a second end of the reaction vessel; and a gas exhaust part connected to the substrate processing chamber, the baffle structure including a first plate and a second plate formed to overlap each other via a space, and having a height smaller than a distance between the gas introduction port and an upper end of the coil.

What is claimed is:

1. A substrate processing apparatus comprising:
a reaction vessel having a tubular shape;
a cover installed at a first end of the reaction vessel;
a resonance coil wound on an outer circumference of the reaction vessel;
a first baffle installed between the cover and an upper end of the resonance coil with a first gap between an outer circumference of the first baffle and an inner circumference of the reaction vessel along the outer circumference of the first baffle;
a second baffle installed between the first baffle and the upper end of the resonance coil with a second gap between an outer circumference of the second baffle and the inner circumference of the reaction vessel along the outer circumference of the second baffle, wherein a lower surface of the second baffle is at a height that is higher than that of the upper end of the resonance coil;
a gas introduction port installed at the cover and having a conical shape with a diameter thereof increasing toward a lower surface of the cover; and a gas exhaust pipe connected to the reaction vessel,
wherein the first baffle and the second baffle are free from a hole allowing a gas to flow therethrough.

2. The substrate processing apparatus according to claim 1, further comprising a radio frequency power supply configured to supply radio frequency power to the resonance coil to excite a gas introduced from the gas introduction port to the reaction vessel into a plasma state.

3. The substrate processing apparatus according to claim 1, wherein each of the outer circumference of the first baffle and the outer circumference of the second baffle is disposed without contacting the inner circumference of the reaction vessel.

4. The substrate processing apparatus according to claim 1, wherein the first baffle and the second baffle have substantially a same shape.

5. The substrate processing apparatus according to claim 1, wherein each of the first baffle and the second baffle has a shape conforming to the inner circumference of the reaction vessel.

6. The substrate processing apparatus according to claim 1, wherein a distance between surfaces of the first baffle and the second baffle facing each other ranges from 30 mm to 50 mm.

7. The substrate processing apparatus according to claim 1, wherein a distance between the outer circumference of the first baffle and the inner circumference of the reaction vessel ranges from 0.1 mm to 10 mm.

8. The substrate processing apparatus according to claim 1, further comprising a gas supplying system configured to supply a gas containing at least one of argon gas and helium gas to the gas introduction port.

9. The substrate processing apparatus according to claim 1, wherein a distance between the cover and a surface of the first baffle facing the cover is 5 mm or less.

10. The substrate processing apparatus according to claim 1, wherein the first baffle and the second baffle are fixed to the cover by a bolt inserted into the cover, a first fixing hole formed in the first baffle and a second fixing hole formed in the second baffle.

* * * * *